United States Patent [19]

Sanborn et al.

[11] Patent Number: 4,880,570

[45] Date of Patent: Nov. 14, 1989

[54] ELECTROCONDUCTIVE ADHESIVE

[75] Inventors: James A. Sanborn, Satellite Beach; Bobby J. Boan, Indian Harbour Beach, both of Fla.

[73] Assignee: Harris Corporation, Melbourne, Fla.

[21] Appl. No.: 267,752

[22] Filed: Nov. 2, 1988

Related U.S. Application Data

[63] Continuation-in-part of Ser. No. 846,537, Mar. 31, 1986, abandoned.

[51] Int. Cl.$^4$ .............................................. H01B 1/06
[52] U.S. Cl. .................................. 252/512; 252/513; 252/514; 252/515; 252/518; 252/519; 523/457; 523/458; 523/459
[58] Field of Search .............. 252/512, 513, 514, 518, 252/519, 515; 523/457, 458, 459

[56] References Cited

U.S. PATENT DOCUMENTS

| | | | |
|---|---|---|---|
| 2,379,976 | 7/1945 | Maddock | 260/41 |
| 2,444,034 | 6/1948 | Collings et al. | 106/193 |
| 2,991,257 | 7/1961 | Smith-Johannsen | 252/506 |
| 3,332,867 | 7/1967 | Miller et al. | 204/197 |
| 3,359,145 | 12/1967 | Salyer et al. | 156/1 |
| 3,932,311 | 1/1976 | Caldwell et al. | 252/514 |
| 3,983,075 | 9/1976 | Marshall et al. | 252/511 |
| 4,054,714 | 10/1977 | Mastrangelo | 428/328 |
| 4,113,981 | 9/1978 | Matsudo et al. | 174/88 R |
| 4,147,669 | 4/1979 | Shaheen et al. | 252/512 |
| 4,389,340 | 6/1983 | Levy | 252/512 |
| 4,410,457 | 10/1983 | Fujimura et al. | 252/514 |
| 4,696,764 | 9/1987 | Yamazaki | 252/503 |

*Primary Examiner*—Josephine Barr
*Attorney, Agent, or Firm*—John L. DeAngelis, Jr.

[57] ABSTRACT

An electrically conductive epoxy-based adhesive. The epoxy is selected from the amine curing modified epoxy family consisting of a resin that is a combination of polygylcidylaminophenyl resin and polygylcidylether of phenylformaldehyde novalac resin family and a catalyst that is a combination of one member from the aliphatic amide family plus one member from the aliphatic polyamine family. In one embodiment includes 17 parts by weight of the resin and 10 parts by weight of the catalyst. 73 parts by weight of a mixture of properly shaped silver flake particles are added. The resulting adhesive is curable at room temperature to provide a high-temperature, high-strength, electrically conductive adhesive.

5 Claims, No Drawings

ELECTROCONDUCTIVE ADHESIVE

This is a continuation-in-part of co-pending application Ser. No. 846,537, filed on Mar. 31, 1986, now abandoned.

FIELD OF THE INVENTION

This invention relates to a process and product for bonding two or more conductors with an electrically conductive adhesive that is curable at room temperature and exhibits high-temperature and high-strength properties.

BACKGROUND OF THE INVENTION

The bonding of electrically conducting materials is generally accomplished using metal-containing solders. In their unaltered form, organic adhesives are not generally considered for creating an electrically conductive bond because although the bond provided exhibits high strength, it does not allow the flow of electrons across the bond. That is, unaltered organic adhesives act as insulators rather than conductors. Since the use of solders often requires temperatures that may be impracticable for a given environment, it is desirable to have an electrically conductive adhesive. For example, in some applications where a printed wiring board cannot withstand soldering temperatures it is necessary to use an adhesive. Also, when heat is applied to any metal it may lose its dimensional stability, therefore suggesting the use of adhesives for bonding in place of soldering or welding. EMI (electromagnetic interference) and RFI (radio-frequency interference) shields generally consist of metal pieces with gaskets at the joints to ensure minimal EMI/RFI leakage. Although these gaskets can be soldered or welded to the metal, the high temperatures required by these operations may reduce the metal compliancy and degrade the EMI/RFI performance. To overcome this problem adhesive bonding is often employed. In field repair work it is often easier to use an electroconductive adhesive than soldering or welding.

There are many types of electrically conductive adhesives and pastes available. These pastes or adhesives contain electrically conducting particles incorporated into the self-hardening organic adhesive. The particles, including carbon black, copper, silver, or other noble metals, are mixed with the non-conducting organic adhesive to facilitate the flow of electrical current through the adhesive bonding layer. It has been observed that a decrease in the electrical resistivity of the bonding layer is generally at the expense of the bond strength. To obtain good conductivity the electrically-conducting filler must be used in such high proportions with respect to the organic adhesive that either inadequate adhesion and/or a weak bonding layer results. None of the available electroconductive adhesives exhibit desirable high-strength and high-temperature characteristics. Due to the use of essentially homogeneous shapes for the conductive filler, the prior art electroconductive adhesives exhibit one or more of the following undesirable properties: excessive resistivity, inadequate shear strength, a change in the modulus (i.e., rigidity or stiffness) of the adhesive, and a change in the coefficient of thermal expansion of the adhesive.

One such electrically conductive adhesive is disclosed in U.S. Pat. No. 3,359,145. The composition consists essentially of a hardenable organic adhesive in the mobile state and from 5% to 60% by weight of a ferromagnetic electrically conducting, finely particulated filler. One interface of the adhesive layer and the item to be bonded is maintained normal to the lines of force of an external magnetic field while the adhesive is hardening to orient the particles of the filler toward the opposite interface.

SUMMARY OF THE INVENTION

The present invention overcomes the disadvantages discussed above by providing an electrically conductive adhesive having both good conductivity and good adhesive shear strength. The electrically conductive adhesive of the present invention uses an epoxy resin system including a two-part resin and a two-part catalyst. The resin consists of a combination of polygylcidylaminophenyl resin and polygylcidylether of phenylformaldehyde novalac resin. The catalyst consists of a combination of a combination of one member from the aliphatic amide family plus one member from the aliphatic polyamine family. One example of a suitable adhesive system is Hysol Corporation's Product Number EA 956. (Hysol Aerospace and Industrial Products Division of The Dexter Corporation; 2850 Willow Pass Road; Pittsburgh, CA 94565) as the catalyst combination. The conductive filler in the preferred embodiment is a mixture of differently shaped silver particles such as Handy and Harmon Corporation's (1770 King's Highway; Fairfield, CT 06430) Silflake No. 135. This product is a mixture of differently-shaped and randomly distributed silver particles ranging in size from 2 to 15 microns. In the preferred embodiment, the formula used was 17 parts by weight of the EA 956 resin, 10 parts by weight of the EA 956 catalyst, and 73 parts by weight of Silflake 135. This adhesive cures at room temperature and exhibits desirable high-strength and electro-conductive characteristics. It is desirable to have a room temperature curable adhesive so that no temperature stresses are placed on the materials being bonded.

Combining the variously shaped metallic particles with high-strength, high temperature epoxy results in a product having strength characteristics almost twice that of typical conductive epoxies and wide-range thermal properties. As discussed above, this epoxy is very useful in aerospace applications where these properties are required.

DESCRIPTION OF THE PREFERRED EMBODIMENTS

The composition of the present invention includes an epoxy resin system from the amine curing modified epoxy family consisting of a resin combination of polygylcidylaminophenyl resin and polygylcidylether of phenylformaldehyde novalac resin, plus a catalyst consisting of a combination of one member from the aliphatic amide amine family plus one member from the aliphatic polyamine family. For example, Hysol Corporation's epoxy resin system EA 956 is a suitable epoxy. In the preferred embodiment the conductive filler is a silver mixture with the mixture including a variety of properly shaped silver particles. Any conductive material, so long as the mixture has properly shaped particles, is suitable for use in the adhesive of the present invention. The use of differently-shaped particles allows maximum packing or nesting, also referred to as low steric interference. In the preferred embodiment, the conductive filler used was Handy and Harmon Corporation's Silflake No. 135. The formula for the preferred embodiment is 17 parts by weight of the EA 956 resin, 10 parts by weight of the EA 956 catalyst, and 73 parts by weight of Silflake 135. The composition was obtained by combining the above materials and mixing until a uniform color was present.

Using this formula, five sets of lap shear specimens were joined and cured for 24 hours at room temperature prior to testing. The lap sheer specimens were made by applying the mixed composition to 2024-T3 aluminum (available from Cincinnati Testing Laboratory), which was chromic-sulfuric acid etched for bonding. The results of the tensile strength and electroconductivity tests are shown below. The five lap shear specimens were tested on the Instron 1125 test machine.

For mixture with 73% by weight Silfake 135.
DC electrical resistivity at 25° C.: 0.001 ohms-cm.
Shear strength test results:
  1320 psi
  1260 psi
  1340 psi
  1320 psi
  1320 psi
Average shear strength: 1312 psi For other weight percentages of filler the results were as follows:

| Filler % by Weight | DC Resistivity At 25° C. (ohms-cm) |
| --- | --- |
| 50% | Too large to measure |
| 60% | Too large to measure |
| 65% | 0.002 |
| 75% | 0.001 |

The above examples show that the optimum filler percentage is approximately 73%. It is possible, however, to reduce the filler quantity to approximately 65% with a attendant increase in volume resistivity to approximately 0.002 ohms-cm. The adhesive of the present invention exhibits desirable adhesive and resistivity properties when the constituent elements are above the following thresholds: 10% for the epoxy resin, 5% for the epoxy catalyst and 65% for the filler. These percentages are not additive to 100% at the thresholds.

Several samples were also subjected to a thermal cycling test, with the following results. These samples contained 73% by weight of conductive filler.

| No. of Cycles | Cycle Temperatures | Average Shear Strength |
| --- | --- | --- |
| 25 | 23° C./177° C. | 1183 psi |
| 25 | 23° C./−65° C. | 936 psi |

The resistivity remained constant at 0.001 ohms-cm during these thermal cycling tests.

Outgassing tests were also performed on the novel adhesive of the present invention. In a simulated space environment (i.e., less than $10^5$ torr and 125° C.) the total mass lost is less than 1%. The total condsible volatile material is less than 0.1%.

It is important that the conductive material added to the epoxy consist of a mixture of properly shaped particles. The properly shaped particles allow a tighter compaction of the conducting medium, and thus improve the conductivity of the epoxy. If the conducting particles were all of the same shape, the resistivity would increase dramatically. The steric interference, which is determined by the shape network and quantity of conductive filler, must be low for the adhesive to have suitable resistivity properties. To accomplish this low steric interference, the present invention uses nonuniformly shaped particles, e.g., rods, wedges, balls, and irregulars that allow this adhesive to be conductive in all directions. While silver particles have been used in the preferred embodiment, any conductive particles will perform as well; for example, nickel, copper, gold, aluminum, titanium, tungsten, or zinc. The selection of the conductive material depends on several factors, including the desired conductivity, cost, and the environmental conditions under which the adhesive will be used. It is also possible, in other embodiments, to use a plastic or ceramic particle material and plate the base material with silver, gold, chromium, nickel, copper, etc. to form the conductive particles.

As noted above, the adhesive of the present invention is curable at room temperature. If the application warrants, it is possible to cure the adhesive at an elevated temperature, giving it additional strength and lower resistivity. The adhesive is usable in temperatures up to approximately 350° F.

While we have shown and described several embodiments in accordance with the present invention, it is understood that the same is not limited thereto but is susceptible of numerous changes and modifications as known to one skilled in the art, and we therefore do not wish to be limited to the details shown and described herein but intend to cover all such changes and modifications as are obvious to one of ordinary skill in the art. The above examples are included only for illustrative purposes and are not intended to limit the scope of the invention.

What is claimed is:

1. An electroconductive adhesive consisting essentially of:
   (a) an epoxy resin from the modified epoxy family consisting of a mixture of a polygylcidylaminophenyl compound and a polygylcidylether of polyformaldehyde novolac compound;
   (b) a catalyst consisting of a combination of one member being an aliphatic amide amine and one member being an aliphatic polyamine;
   (c) a mixture of differently shaped conductive particles having a substantially uniform concentration and a random distribution of shapes throughout said adhesive so as to minimize the steric interference and provide conductivity in substantially all directions;
   the percent by weight of (a), (b), and (c) being between 10% and 17%, between 4% and 10%, and between 63% and 73%, respectively.

2. The electroconductive adhesive of claim 1 wherein conductive particles include silver particles.

3. The electroconductive adhesive of claim 1 wherein the electroconductive adhesive is cured at room temperature.

4. The electroconductive adhesive of claim 1 wherein the electroconductive adhesive is cured at an elevated temperature.

5. The electroconductive adhesive of claim 1 wherein the conductive particles comprise a mixture of particles made of different materials.

* * * * *